US011456197B2

(12) United States Patent
Rice et al.

(10) Patent No.: US 11,456,197 B2
(45) Date of Patent: Sep. 27, 2022

(54) SYSTEMS AND METHODS FOR PROVIDING MAINTENANCE ACCESS TO ELECTRONIC DEVICE MANUFACTURING TOOLS

(71) Applicant: APPLIED MATERIALS, INC., Santa Clara, CA (US)

(72) Inventors: Michael R. Rice, Pleasanton, CA (US); Juan Carlos Rocha-Alvarez, San Carlos, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 26 days.

(21) Appl. No.: 16/839,012

(22) Filed: Apr. 2, 2020

(65) Prior Publication Data

US 2021/0183676 A1    Jun. 17, 2021

Related U.S. Application Data

(60) Provisional application No. 62/949,389, filed on Dec. 17, 2019.

(51) Int. Cl.
*H01L 21/677* (2006.01)
*H01L 21/67* (2006.01)

(52) U.S. Cl.
CPC .. *H01L 21/67745* (2013.01); *H01L 21/67196* (2013.01); *H01L 21/67201* (2013.01); *H01L 21/67742* (2013.01)

(58) Field of Classification Search
CPC .............. H01L 21/67196; H01L 21/67201
See application file for complete search history.

(56) References Cited

U.S. PATENT DOCUMENTS 5,364,219 A    11/1994  Takahashi et al.
6,658,762 B2   12/2003  Chang et al.
(Continued)

FOREIGN PATENT DOCUMENTS

JP    H10247675 A     9/1998
KR    20070118546 A  12/2007

OTHER PUBLICATIONS

Ezaki et al. JP 10-247675 A. [Sep. 14, 1998] English language machine translation of Japanese patent publication which was cited in IDS of Apr. 9, 2021. Retrieved Jan. 3, 2022 from Espacenet. (Year: 1998).*

(Continued)

*Primary Examiner* — Jonathan Snelting
(74) *Attorney, Agent, or Firm* — Lowenstein Sandler LLP

(57) ABSTRACT

The disclosure describes devices, systems, and methods for causing a factory interface of an electronic device manufacturing system to be moveable between a first position and a second position. An electronic device manufacturing system can include a transfer chamber, processing chambers connected to the transfer chamber, a load lock connected to the transfer chamber, and a factory interface connected to the load lock. The factory interface can be moveable between a first position and a second position. The factory interface, while oriented in the first position, is positioned for transfer of one or more substrates between the factory interface and the load lock, where at least one of the transfer chamber or the load lock are inaccessible for maintenance while the factory interface is oriented at the first position. The factory interface, while oriented in the second position, is positioned to provide maintenance access to at least one of the transfer chamber or the load lock. The factory interface can include one or more moveable components that cause the factory (Continued)

interface to be moveable between the first position and the second position.

10 Claims, 10 Drawing Sheets

(56) References Cited

U.S. PATENT DOCUMENTS

| | | | |
|---|---|---|---|
| 6,672,820 B1* | 1/2004 | Hanson | C25D 7/12 |
| | | | 414/222.06 |
| 7,607,879 B2 | 10/2009 | Hall et al. | |
| 7,845,892 B2* | 12/2010 | Hugler | H01L 21/6773 |
| | | | 414/217 |
| 8,097,084 B2 | 1/2012 | Geiser et al. | |
| 8,210,789 B2* | 7/2012 | Hashimoto | H01L 21/67775 |
| | | | 414/217 |
| 8,367,565 B2* | 2/2013 | Lei | H01L 21/677 |
| | | | 438/800 |

OTHER PUBLICATIONS

PCT International Search Report and Written Opinion for International Application No. PCT/US2020/065292 dated Apr. 15, 2021, 12 pages.

* cited by examiner

700

Disengage a first portion of a first locking mechanism from a second portion of the first locking mechanism 710

Move the factory interface from a first position to a second position 720

Engage the first portion of the first locking mechanism with a second portion of a second locking mechanism 730

Perform maintenance at one or more processing chambers, a transfer chamber, and/or a load lock 740

Disengage the first portion of the first locking mechanism from the second portion of the second locking mechanism 750

Move the factory interface from the first position to the second position 760

Re-engage the first portion of the first locking mechanism with the second portion of the first locking mechanism 770

FIG. 7

SYSTEMS AND METHODS FOR PROVIDING MAINTENANCE ACCESS TO ELECTRONIC DEVICE MANUFACTURING TOOLS

RELATED APPLICATIONS

This application claims the benefit under 35 U.S.C. § 119(e) of U.S. Provisional Patent Application No. 62/949,389, filed Dec. 17, 2019, which is incorporated herein, in its entirety, by this reference.

TECHNICAL FIELD

Embodiments of the present disclosure relate, in general, to systems and methods for providing maintenance access to electronic device manufacturing tools, and to a movable factory interface.

BACKGROUND

An electronic device manufacturing system can include one or more tools or components for manufacturing substrates. Such tools or components can include a factory interface connected to a load lock and/or transfer chamber. In some instances, an operator of the electronic device manufacturing system can provide maintenance to the manufacturing system tools or components. For example, the operator can access the load lock and/or transfer chamber to perform maintenance on the load lock and/or transfer chamber. Maintenance access space is reserved in electronic device manufacturing systems to allow for the operator to access the tools and/or components during maintenance. The maintenance access space is unused during operation of the electronic device manufacturing system, and therefore is unused for a significant portion of the lifetime of the electronic device manufacturing system. Floor space in a fabrication facility (fab) is typically very costly. Accordingly, the access space that is used for providing access to tools or components in the electronic device manufacturing system increases a cost of ownership of the electronic device manufacturing systems.

SUMMARY

Some of the embodiments described cover an electronic device manufacturing system. The electronic device manufacturing system can include a transfer chamber, processing chambers connected to the transfer chamber, a load lock connected to the transfer chamber, and a factory interface connected to the load lock. The factory interface is moveable between a first position and a second position. The factory interface, when oriented in the first position, is positioned for transfer of one or more substrates between the factory interface and the load lock. At least one of the transfer chamber or the load lock are inaccessible for maintenance while the factory interface is oriented at the first position. The factory interface, while oriented in the second position, is positioned to provide maintenance access to at least one of the transfer chamber or the load lock. The factory interface includes one or more moveable components that cause the factory interface to be moveable between the first position and the second position.

In some embodiments, a factory interface of an electronic device manufacturing system includes at least one port on a first side of the factory interface that is configured to interface with a substrate carrier. The factory interface further includes at least one port on a second side of the factory interface configured to interface with a load lock. The factory interface further includes a robot arm configured to transfer substrates between the substrate carrier and the load lock. The factory interface further includes one or more moveable components that cause the factory interface to be moveable between a first position and a second position. The factory interface, while oriented in the first position, is positioned for transfer of one or more substrates between the substrate carrier and the load lock. At least one of the load lock or a transfer chamber connected to the load lock are inaccessible for maintenance while the factory interface is oriented in the first position.

In some embodiments, a method includes detecting that a factory interface of an electronic device manufacturing system has moved from a first position to a second position. The factory interface, while oriented in the second position, is positioned to provide maintenance access to at least one of a transfer chamber of the electronic device manufacturing system or a load lock of the electronic device manufacturing system. The method further includes, responsive to detecting the factory interface has moved from the first position to the second position, determining that the factory interface is not available for transfer of one or more substrates between the factory interface and the load lock. The method further includes transmitting a first notification to at least one of the factory interface, the load lock, the transfer chamber, or one or more processing chambers connected to the transfer chamber that the factory interface is not available for transfer of one or more substrates between the factory interface and the load lock.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 7 is a method for moving a factory interface between a first and second position, in accordance with embodiments of the present disclosure.

DETAILED DESCRIPTION OF EMBODIMENTS

Figure 1:
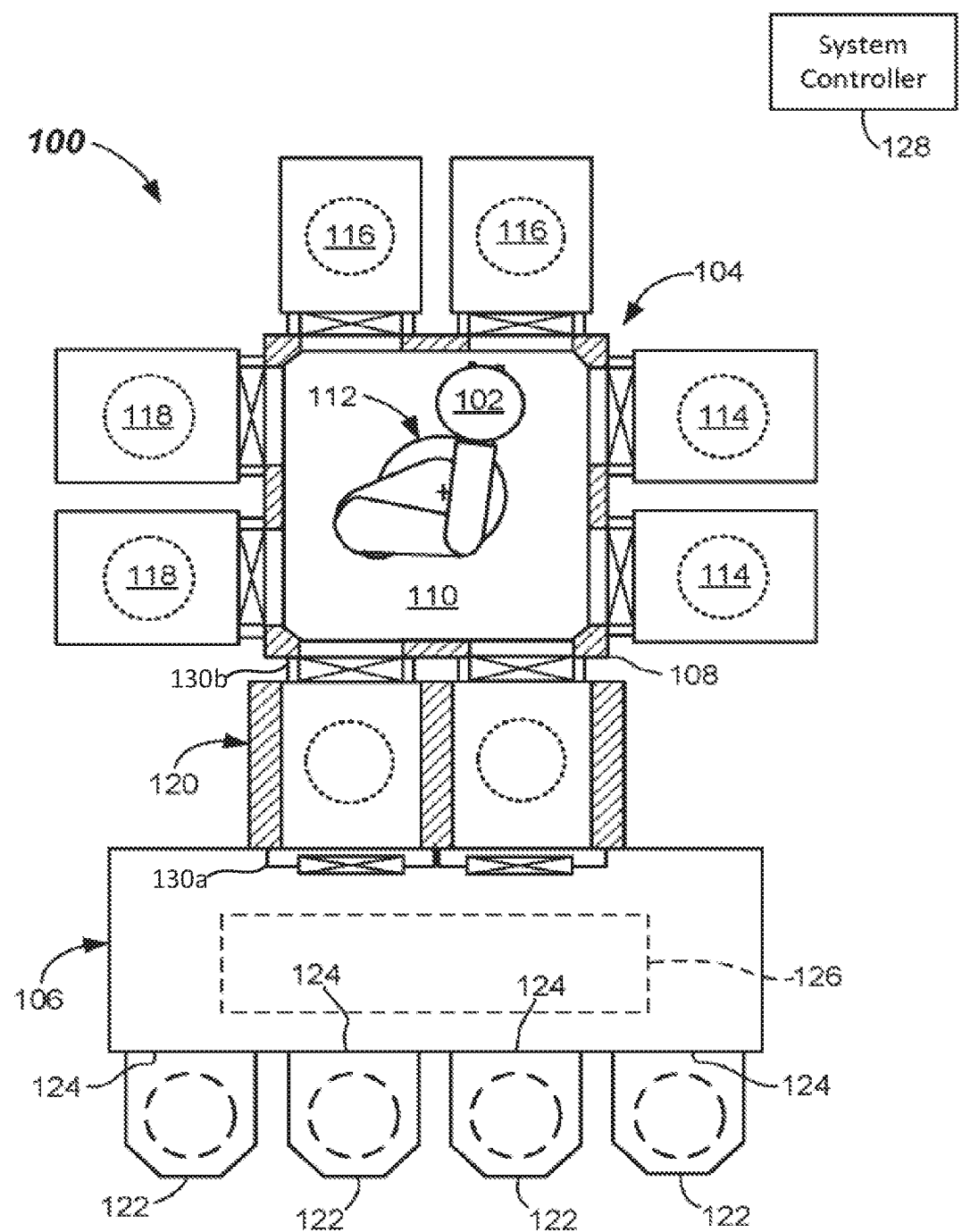
FIG. 1 is a top schematic view of an example electronic device manufacturing system, according to aspects of the present disclosure.

Embodiments described herein are related to systems and methods for providing maintenance access to one or more tools of an electronic device manufacturing system. In embodiments, one or more moveable components are used to move a factory interface of an electronic device manufacturing system from a first position to a second position. The factory interface, while oriented in the first position, is positioned for transfer of one or more substrates between the factory interface and a load lock of the electronic device manufacturing system. In embodiments, when the factory interface is oriented in the first position, at least the load lock and a transfer chamber of the electronic device manufacturing system are inaccessible for maintenance. The factory interface, while oriented in the second position, is positioned to provide maintenance access to at least the load lock and the transfer chamber.

In some embodiments, the one or more moveable components include a linear slide disposed at a bottom of the factory interface. In one embodiment, a stationary component of the linear slide is mounted to a floor of the electronic device manufacturing system and a sliding component is mounted to the bottom of the factory interface. In some embodiments, the sliding component can be configured to slide along the stationary component, causing the factory interface to move along an axis that is approximately parallel to the load lock, as illustrated with respect to FIGS. 2A-3B. In other or similar embodiments, the sliding component and the stationary component can be positioned such that the factory interface moves along an axis that is approximately perpendicular to a face of the load lock (i.e., the factory interface slides away from the load lock). When moved from the first position to the second position, the factory interface can be moved between approximately 24 inches to approximately 60 inches. Movement of the factory interface to the second position provides an opening of between approximately 24 inches to approximately 60 inches to access otherwise inaccessible portions of at least the load lock and the transfer chamber in embodiments.

In other or similar embodiments, the one or more moveable components include a hinge and/or a set of wheels. The set of wheels can be disposed at the bottom of the factory interface. The hinge can be mounted to the factory interface and the load lock to secure a first side of the factory interface to the load lock. A second side of the factory interface can be rotated between approximately 10° to approximately 50° away from the load lock, creating an opening of between approximately 24 inches to approximately 60 inches.

The one or more moveable components can also include a vertical slide disposed on one or more side of the factory interface. In some embodiments, a sliding component of the linear slide is mounted to a side of the factory interface that interfaces with the load lock. The portion of the load lock that interfaces with the side of the factory interface can include a stationary component configured to engage with the sliding component. The factory interface can be lifted from the floor of electronics device manufacturing system to create an opening that is accessible from underneath the factory interface. As the factory interface is lifted from the floor of the electronics device manufacturing system, the sliding component of the vertical slide can slide along the stationary component of the vertical slide such to facilitate the vertical motion of the factory interface. In some embodiments, the factory interface can be lifted approximately 24 inches to approximately 60 inches from the ground.

By providing a mechanism to move the factory interface from a first position to a second position, maintenance access can be provided to one or more tools of an electronic device manufacturing system in instances when maintenance access is called for. An electronic device manufacturing system can be designed to include an optimal amount of operating tools or components without including maintenance access space that is unused during operation of the electronic device manufacturing system (which is a signification portion of the lifetime of the electronic device manufacturing system). Use of a movable factory interface as provided in embodiments eliminates dedicated maintenance access space. Thus, floor space in a fab that would ordinarily be reserved for maintenance access can instead be used to connect additional tools or components (e.g., additional process chambers) to a transfer chamber of the electronic device manufacturing system. Accordingly, embodiments can increase the number of chambers that are attached to transfer chambers in an electronic device manufacturing system, increase the chamber density of the electronic device manufacturing system, and/or reduce the cost of ownership of the electronic device manufacturing system. By including an optimal amount of operating tools or components in the electronic device manufacturing system, overall system yield and/or cost can be improved.

FIG. 1 is a top schematic view of an example electronic device manufacturing system, according to aspects of the present disclosure. Electronic device manufacturing system 100 (also referred to as an electronics processing system) is configured to performs one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing system 100 includes a process tool (e.g., a mainframe) 104 and a factory interface 106 coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Example of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to an at or near atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 are configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers (also referred to as containers) 122 and load lock 120. In other and/or similar embodiments, factory interface 106 is configured to receive replacement parts from replacement parts storage containers 123. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings.

Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

In some embodiments, transfer chamber 110, process chambers 114, 116, and 118, and/or load lock 120 are maintained at a vacuum level. Electronic device manufacturing system 100 can include one or more vacuum ports that are coupled to one or more stations of electronic device manufacturing system 100. For example, first vacuum ports 130a can couple factory interface 106 to load locks 120. Second vacuum ports 130b can be coupled to load locks 120 and disposed between load locks 120 and transfer chamber 110.

In some embodiments, one or more utility lines (not shown) are configured to provide utilities to factory interface 106. The utility lines can include a power utility line configured to provide power to factory interface 106, an air utility line configured to provide air to factory interface 106 (e.g., a clean dry air (CDA) utility line), a vacuum utility line configured to provide a vacuum to first vacuum ports 130a and/or to the interior chamber of the factory interface 106, and/or a nitrogen utility line configured to provide nitrogen to factory interface 106.

One of more utility cables can be configured to protect the one or more utility lines. For example, each utility line can be enclosed within a utility cable. Multiple utility lines can be enclosed within the same utility cable and/or utility lines can be included within separate utility cables. A first end of each utility cable can be mounted to an outlet of a utility supply (e.g., a power supply, an air supply, a vacuum pump, a nitrogen supply, etc.). In some embodiments, the outlet of a utility supply is connected to the floor (or a wall) of electronic device manufacturing system 100. As such, the first end of each utility cable can be mounted to the ground of the fab (e.g., the ground over which the factory interface 106 is installed). A second end of each utility cable can be mounted to an inlet of factory interface 106. In some embodiments, the inlet is located at a bottom of factory interface 106. As such, the second end of each utility cable is mounted to the bottom of factory interface 106.

In some implementations, factory interface 106 includes one or more moveable components that cause factory interface 106 to be movable between a first position and a second position. The one or more moveable components can include at least one of a hinge, a slide, or a set of wheels. Further details regarding the one or more moveable components are described with respect to FIGS. 2A-4B. Factory interface 106, while oriented in the first position, is positioned for transfer of one or more substrates 102 between factory interface 106 and load lock 120.

In some instances, an operator of electronic device manufacturing system 100 performs maintenance for factory interface 106, load lock 120, transfer chamber 110, and/or at least one of processing chambers 114, 116, 118. In some embodiments, the operator performs maintenance by accessing factory interface 106, load lock 120, transfer chamber 110, or at least one of processing chambers 114, 116, 118 from underneath load lock 120 and/or transfer chamber 110. In order to access factory interface 106, load lock 120, transfer chamber 110, or processing chambers 114, 116, 118 from underneath load lock 120 and/or transfer chamber 110, the operator can move factory interface 106 from the first position to a second position, as described with respect to FIGS. 2A-4B.

In some embodiments, electronic device manufacturing system 100 includes one or more locking mechanisms to secure factory interface 106 in either the first position or the second position. A first portion of a locking mechanism can be fastened to factory interface 106 and a second portion of the locking mechanism can be fastened to load lock 120. The first portion of the locking mechanism can engage the second portion of the locking mechanism such to secure factory interface 106 in the first position during operation of electronic device manufacturing system 100. The locking mechanism can also include positionally registering components to facilitate securing factory interface 106 in the first position after factory interface 106 has been moved to the second position. The positionally registering components can include any components configured to secure factory interface 106 in the first position after factory interface 106 has been moved to the second position (e.g., one or more plates and a securing component, a ball in a slot, etc.). In an illustrative example, a first portion of the locking mechanism includes a first plate and the second portion of the locking mechanism includes a second plate, where a fastening component, such as a screw, is fed through a hole of the first plate and the second plate in order to secure factory interface in the first position.

In some embodiments, the locking mechanism is a first locking mechanism and electronic device manufacturing system 100 includes a second locking mechanism. The second locking mechanism can include a first portion and a second portion. In some embodiments, the first portion of the first locking mechanism engages with the second portion of the second locking mechanism to secure the factory interface 106 in the second position. In some embodiments, the first locking mechanism and/or the second locking mechanism include a sensor that detects when the first portion of locking mechanism is engaged and/or disengaged from the second portion of the locking mechanism. In some embodiments, the first locking mechanism includes a sensor and the second locking mechanism does not include a sensor. The sensor of the first locking mechanism detects whether the factory interface 106 is secured in the first position (i.e., the first portion of the first locking mechanism is engaged with the second portion of the second locking mechanism).

In some embodiments, when factory interface 106 is moved from the second position to the first position, the first portion of the first locking mechanism engages with the second portion of the first locking mechanism such that factory interface 106 is secured in approximately the same orientation as before factory interface 106 was moved from the first position to the second position. In such embodiments, components of factory interface 106, such as factory interface robot 126, is be re-calibrated prior to initiating transfer of one or more substrates 102 between factory interface 106 and load lock 120. For example, the factory interface is calibrated while in the first position. The factory interface can then be placed in the second position, and then again in the first position, and the initial calibration that was performed can still be accurate.

Electronic device manufacturing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). In embodiments, execution of the instructions by system controller 128 causes system controller to perform the methods of one or more of FIG. 5. System controller 128 can also be configured to permit entry and display of data, operating commands, and the like by a human operator.

As discussed above, an operator of electronic device manufacturing system 100 can access factory interface 106, load lock 120, transfer chamber 110 or at least one of processing chambers 114, 116, 118, from underneath load lock 120 and/or transfer chamber 110 by causing factory interface 106 to be moved from a first position to a second position. The operator can cause a first portion of the locking mechanism (e.g., the first locking mechanism or the second locking mechanism) that secures factory interface 106 in the first position to disengage from a second portion of the locking mechanism. In response to the first portion of the locking mechanism disengaging from the second portion of the locking mechanism, system controller 128 can detect that factory interface 106 has moved from the first position to the second position. For example, system controller 128 can receive a signal indicating that the factory interface 106 has moved from the first position to the second position and/or that the locking mechanism has been disengaged (e.g., that the factory interface is no longer locked to the first position). In some embodiments, system controller 128 detects that the factory interface 106 has moved from the first position to the second position based on an indication, received from the sensor of the locking mechanism, that the first portion of the locking mechanism has disengaged from the second portion of the locking mechanism. In some embodiments, system controller 128 can detect that the factory interface 106 has moved from the first position to the second position based on an indication received from a sensor of the first locking mechanism that the first portion of the first locking mechanism has disengaged from the second portion of the first locking mechanism. In other or similar embodiments, system controller 128 can detect that the factory interface 106 has moved from the first position to the second position based on an indication received from a sensor of the second locking mechanism that the first portion of the first locking mechanism has engaged with a second portion of the second locking mechanism.

In response to detecting that the factory interface 106 has moved from the first position to the second position, system controller 128 can determine that factory interface 106 is not available for transfer of one or more substrates 102 between factory interface 106 and load lock 120. System controller 128 can transmit a notification to at least one of factory interface 106, load lock 120, transfer chamber 110, or processing chambers 114, 116, 118 that factory interface 106 is not available for transfer of one or more substrates 102 between factory interface 106 and load lock 120.

Upon completion of the maintenance of factory interface 106, load lock 120, transfer chamber 110 or at least one of processing chambers 114, 116, 118, the operator can move factory interface 106 from the second position to the first position. The operator can cause the first portion of the locking mechanism to re-engage with the second portion of the locking mechanism in order to secure factory interface 106 in the first position. System controller 128 can detect that factory interface 106 has moved from the second position to the first position and/or that the locking mechanism has been re-engaged (e.g., that the factory interface is locked to the first position). In some embodiments, system controller 128 can detect that factory interface 106 has moved from the first position to the second position based on an indication, received from the sensor of the locking mechanism, that the first portion of the locking mechanism has engaged with the second portion of the locking mechanism. In response to detecting that factory interface 106 has moved from the first position to the second position, system controller 128 can determine that factory interface 106 is available for transfer of one or more substrates 102 between factory interface 106 and load lock 120. System controller can transmit a notification to at least one of factory interface 106, load lock 120, transfer chamber 110, or one or more of processing chambers 114, 116, 118 that factory interface 106 is available for transfer of one or more substrates between factory interface 106 and load lock 120.

Figure 2A:
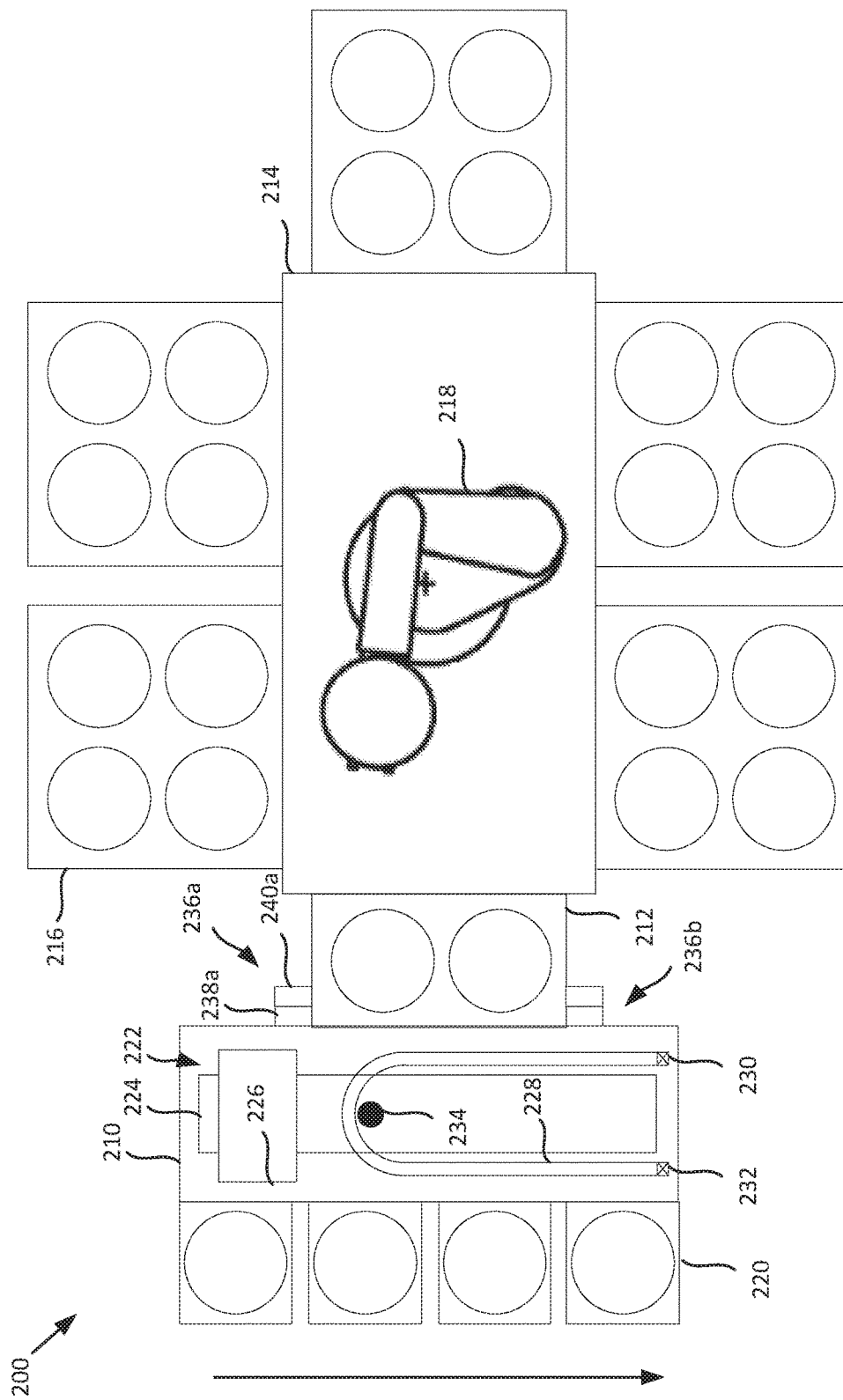
FIG. 2A is a top schematic view of an electronic device manufacturing system including a factory interface oriented at a first position, according to aspects of the present disclosure.

FIG. 2A is a top schematic view of an electronic device manufacturing system 200 including a factory interface 210 oriented at a first position, according to aspects of the present disclosure. Factory interface 210 can be a factory interface of electronic device manufacturing system 200, such as factory interface 106 of electronic device manufacturing system 100. Electronic device manufacturing system 200 can include at least a load lock 212, a transfer chamber 214, and one or more processing chambers 216. Transfer chamber 214 can include a transfer chamber robot 218, which can be configured to transfer substrates to and/or from load lock 212 to a processing chamber 216, in accordance with previously described embodiments. Factory interface 210 can be configured to receive substrates from substrate carriers 220, in accordance with previously described embodiments.

Factory interface 210 can include one or more moveable components that cause factory interface 210 to be moveable between a first position and a second position. In some embodiments, the one or more moveable components include a linear slide 222 disposed at the bottom of factory interface 210. The linear slide 222 can include at least a stationary component 224 and a sliding component 226. Stationary component 224 can be mounted to a floor of electronic device manufacturing system 200 and therefore can remain stationary as factory interface 210 is moved between the first and second position. Sliding component 224 can be mounted to the bottom of factory interface 210 and can move along stationary component 224 (e.g., slide) as factory interface 210 is moved between the first and second position. In some embodiments, linear slide 222 permits motion of factory interface 210 (e.g., a sliding motion) along an axis that is approximately parallel to a first side of load lock 212. In other or similar embodiments, linear slide 222 permits motion of factory interface 210 along an axis that is approximately perpendicular to the first side of the load lock 212 (i.e., factory interface 210 is configured to slide away from the first side of the load lock 212). In other or similar embodiments, linear slide is positioned on a side of the factory interface (e.g., a side facing load lock 212), and permits vertical sliding of the factory interface 210. In some embodiments, linear slide 222 is disposed at the bottom of factory interface 210 such that factory interface can only be moved in a single direction, as illustrated in FIG. 2A.

As previously described, one or more utility lines can be configured to provide utilities to factory interface 210. The utility lines can include a power utility line, an air utility line, a vacuum utility line, or a nitrogen utility line. In some embodiments, a utility cable 228 (or multiple utility cables) can be configured to protect one or more utility lines. A first end 230 of utility cable(s) 228 can be mounted to an outlet of a utility supply. In some embodiments, the outlet of the utility supply is connected to the floor of electronic device manufacturing system 200. As such, first end 230 of utility cable 228 is connected to the floor beneath the factory interface 210 at a fixed position in the floor. A second end 232 of utility cable can be connected to an inlet of factory interface 210. In some embodiments, the inlet is located at a bottom of factory interface 210. As such, the first end 232 of utility cable 228 is mounted to the bottom of factory interface 210.

In some embodiments, utility cable 228 is long enough to allow for the first end 230 of utility cable 228 to be connected to the outlet of the utility supply (which can be in the floor) and the second end 232 of utility cable 228 to be connected to the inlet of factory interface 210 as factory interface 210 is moved between the first and second position. For example, factory interface 210 can be moved between approximately 24 inches to approximately 60 inches when factory interface 210 is moved from the first position to the second position. In such examples, utility cable 228 can be long enough to allow for factory interface 210 to be moved between approximately 24 inches to approximately 60 inches while allowing the first end 230 of utility cable 228 to be mounted to the outlet of the utility supply and the second end 232 of utility cable 228 to be mounted to the inlet of factory interface 210.

Figure 2B:
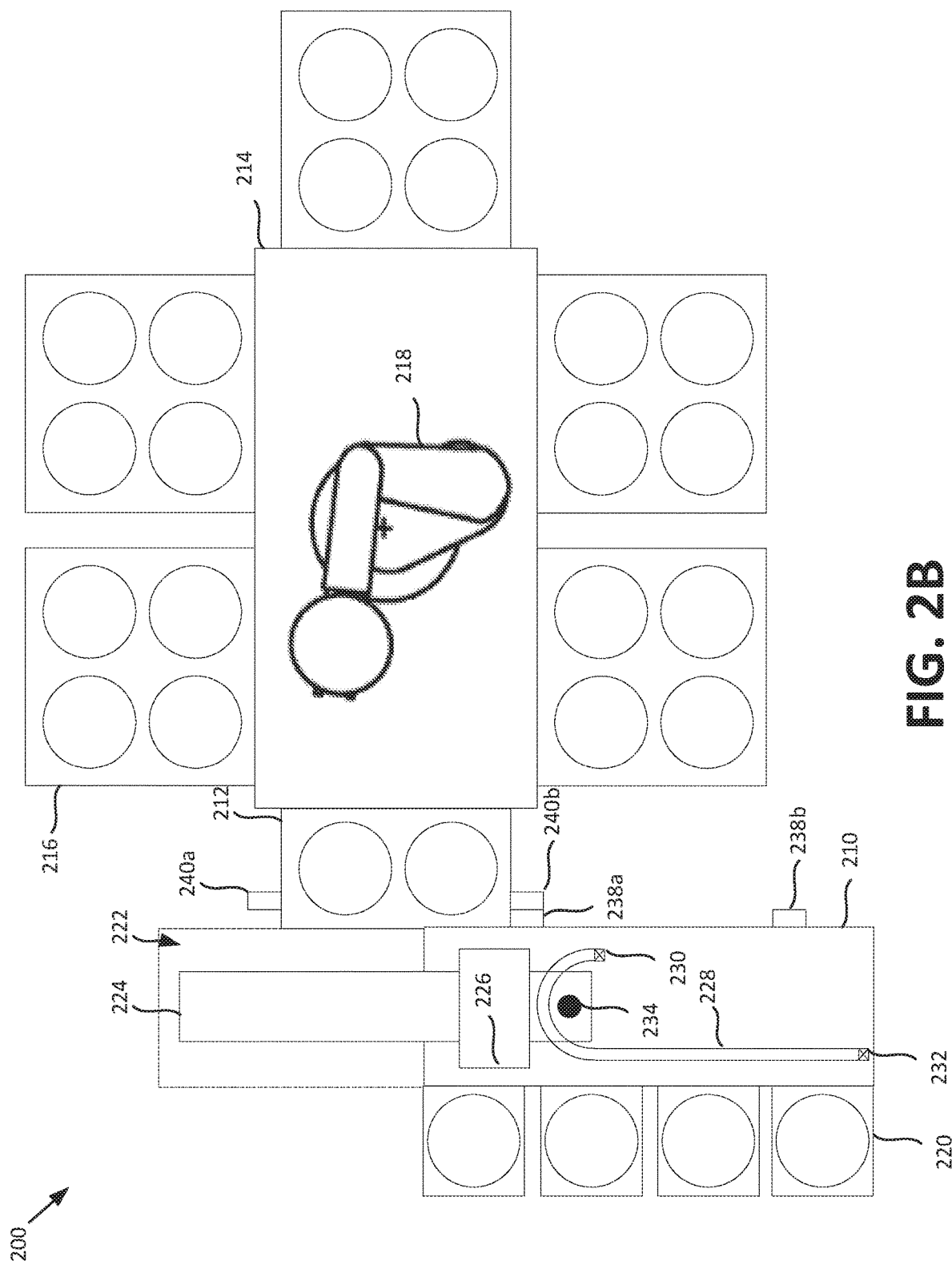
FIG. 2B is a top schematic view of an electronic device manufacturing system including a factory interface oriented at a second position, according to aspects of the present disclosure.

The utility supply can be located at a first side of the factory interface, and the inlet of the factory interface 210 can be located at a second side of the factory interface. When the factory interface moves, the inlet moves and the utility supply stays in place. Accordingly, the distance between the utility supply and the inlet changes with changes in position of the factory interface. The length of the utility cable(s) 228 can be at least the maximum distance between the inlet and the utility supply (e.g., which is achieved when the factory interface is in the second position). In some embodiments, utility cable(s) 228 is mounted to the bottom of factory interface 210 and the utility supply such that the utility cable(s) 228 forms a u-shape when the factory interface is in the first position, as shown in FIG. 2A. While the factory interface is in the first position, the utility cables(s) 228 can have a bend at approximately a middle of the utility cables(s) 228. As factory interface 210 moves between the first position to the second position, utility cable(s) 228 can change shape such that the portion of the utility that has a bend changes. As illustrated in FIG. 2A, utility cable can be positioned along a fixed point 234 of the bottom of factory interface 210 such to create a semi-circle shape around a fixed point 234. One or more portions of utility cable 228 can maintain the semi-circle shape around the fixed point 234 as factory interface 210 is moved from the first position to the second position, as illustrated in FIG. 2B. For example, when the factory interface chamber is in the second position, the bend can no longer be at a center of the utility cable(s) 228, and can instead be near one end of the utility cable(s) 228 (e.g., causing the utility cable(s) 228 to have a j-shape).

During operation, factory interface 210 can be oriented in a first position, as illustrated in FIG. 2A. Electronic device manufacturing system 200 can include one or more locking mechanisms, such as locking mechanism 236a and/or locking mechanism 236b. One or more locking mechanisms 236a, 236b can be configured to secure factory interface 210 in the first position during operation of electronic device manufacturing system 200 or in the second position during maintenance of factory interface 210, load lock 212, transfer chamber 214 or one or more processing chambers 216.

Factory interface 210 can include one or more portions of a first locking mechanism 236a, that secures factory interface 210 in the first position during operation of electronic device manufacturing system 200. In some embodiments, locking mechanism 236a includes a first portion 238a and a second portion 236. First portion 238a of locking mechanism 236a can be mounted to factory interface 210. Second portion 236 of locking mechanism 236a can be mounted to load lock 212. First portion 238a of locking mechanism 236a can be configured to engage with second portion 236 of locking mechanism 236a. When first portion 238a is engaged with second portion 236 of locking mechanism 232a, factory interface 210 can be secured in the first position. In an illustrative example, a first portion of locking mechanism 236a can include a first plate and a second portion of locking mechanism 236a can include a second plate. During operation of electronic device manufacturing system 200, a fastening component, such as a screw, can be fed through a hole of the first plate and the second plate of locking mechanism 236a in order to secure factory interface 210 in the first position.

Factory interface 210 can include one or more portions of at least a second locking mechanism, such as locking mechanism 236b. In some embodiments, locking mechanism 236b can be the same type of locking mechanism as locking mechanism 236a. In other or similar embodiments, one or more portions of locking mechanism 236a can be configured to engage with one or more portions of locking mechanism 236b. Locking mechanism 232b can be used with locking mechanism 236a to secure factory interface 210 in the first position during operation of electronic device manufacturing system 200. In some embodiments, locking mechanism 236b can also be used to secure factory interface 210 in the second position during operation of electronic device manufacturing system 200, as described further with respect to FIG. 2B.

FIG. 2B is a top schematic view of an electronic device manufacturing system 200 including a factory interface 210 oriented at a second position, according to aspects of the present disclosure. In some instances, a factory operator provides maintenance for factory interface 210, load lock 212, transfer chamber 214, and/or one or more processing chambers 216. In such instances, factory interface 210 is moved from the first position to a second position to provide maintenance access to factory interface 210, load lock 212, transfer chamber 214 and/or processing chambers 216. To move factory interface 210 from the first position to the second position, the operator can cause at least first portion 238a of locking mechanism 236a to disengage from second portion 240a of locking mechanism 236b. In some embodiments, the operator also causes at least first portion 238a of locking mechanism 236b to disengage from second portion 240b of locking mechanism 236b.

In some embodiments, locking mechanism 236b can also be used to secure factory interface 210 in the second position during maintenance of factory interface 210, load lock 212, transfer chamber 214, and/or one or more processing chambers 216. In such embodiments, a first portion 238a of locking mechanism 236a engages with second portion 240b of locking mechanism 236b when factory interface 210 moved to the second position. In accordance with the previous illustrative example, the first portion 238b of locking mechanism 236b can include a first plate and the second portion 240b of locking mechanism 236b can include a second plate. When factory interface 210 is moved from the first position to the second position, the first plate of locking mechanism 236a aligns with the second plate of locking mechanism 236b. The fastening component can be fed through the hole of the first plate of locking mechanism 236b and the hole of the second plate of locking mechanism 236b in order to secure factory interface 210 in the second position.

In some embodiments, factory interface 210, when moved from the first position to the second position, is moved between approximately 24 inches to approximately 60 inches. In other or similar embodiments, factory interface 210, when moved from the first position to the second position, is moved between approximately 24 inches to approximately 36 inches. In some embodiments, factory interface 210 can be manually moved from the first position to the second position once the locking mechanism 236b is disengaged or unlocked. In some embodiments, the factory interface 210 can be manually moved using a component that replaces the functionality of a motor (e.g., a hand crank, etc.). Alternatively, factory interface 210 can include a motor or other movement assembly (e.g., a rotary motor and ballscrew, a pneumatic cylinder, a belt and pulley system, etc.) that automatically moves the factory interface 210 from the first position to the second position.

As previously described, a first end 230 of utility cable 228 can be mounted to an outlet of a utility supply (e.g., connected to the floor of electronic device manufacturing system 200). A second end 232 of utility cable can be mounted to an inlet of factory interface 210. As previously described, utility cable 228 can be long enough to allow for the first end 230 of utility cable 228 to be fastened to the outlet of the utility supply and the second end 232 of utility cable 228 to be mounted to the inlet of factory interface 210 as factory interface 210 is moved between the first and second position (e.g., approximately 24 inches to approximately 60 inches). Portions of utility cable 228 can rotate along the fixed point 234 at the bottom of factory interface 210 such to maintain the semi-circle shape along the fixed point 234 as factory interface 210 is moved from the first position to the second position.

Upon completion of the maintenance of factory interface 210, load lock 212, transfer chamber 214, or one or more processing chambers 216, the operator or automated mechanism of factory interface 210 can move factory interface 210 from the second position to the first position. The operator can cause the first portion 238a of locking mechanism 236a to re-engage with second portion 240b of locking mechanism 236b in order to secure factory interface 210 in the first position. Alternatively, the first portion 238a of locking mechanism 236a can automatically re-engage with second portion of locking mechanism 236b. In some embodiments, when factory interface 210 is moved from the second position to the first position, first portion 238a of locking mechanism 236a can engage with second portion 236 of locking mechanism 236a such that factory interface 210 is secured in approximately the same orientation as before factory interface 210 was moved from the first position to the second position. In such embodiments, components of factory interface 210 (e.g., a factory interface robot) do not have to be re-calibrated prior to the initiation of one or more substrates being transferred between factory interface 210 and load lock 212.

FIG. 2B shows the factory interface 210 that has been moved in a first direction to transfer the factory interface from the first position to the second position. Alternatively, the factory interface 210 can be configured to enable the factory interface 210 to move in a second direction that is opposite the first direction to transfer the factory interface 210 from the first position to the second position.

In some embodiments (not shown) the one or more moveable components can include a vertical slide disposed at a first side of factory interface 210. In some embodiments, the first side of the factory interface 210 can include the side of the factory interface 210 that interfaces with the load lock 212. The vertical slide can include at least a stationary component and a sliding component. The sliding component can be mounted to the first side of the factory interface 210. The stationary component can be mounted to a first side of the load lock 212, such as the side of the load lock 212 that interfaces with the first side of the factory interface 210. The factory interface 210 can be lifted from the ground of the electronic device manufacturing system 200. As the factory interface 210 is lifted from the ground of the electronics device manufacturing system, the sliding component of the factory interface 210 can move along the stationary component of the load lock 212 such to facilitate movement of the factory interface 210 along the load lock 212. In some embodiments, the factory interface 210 can be lifted approximately 24 inches to approximately 60 inches from the ground of the electronics device manufacturing system.

Figure 3A:
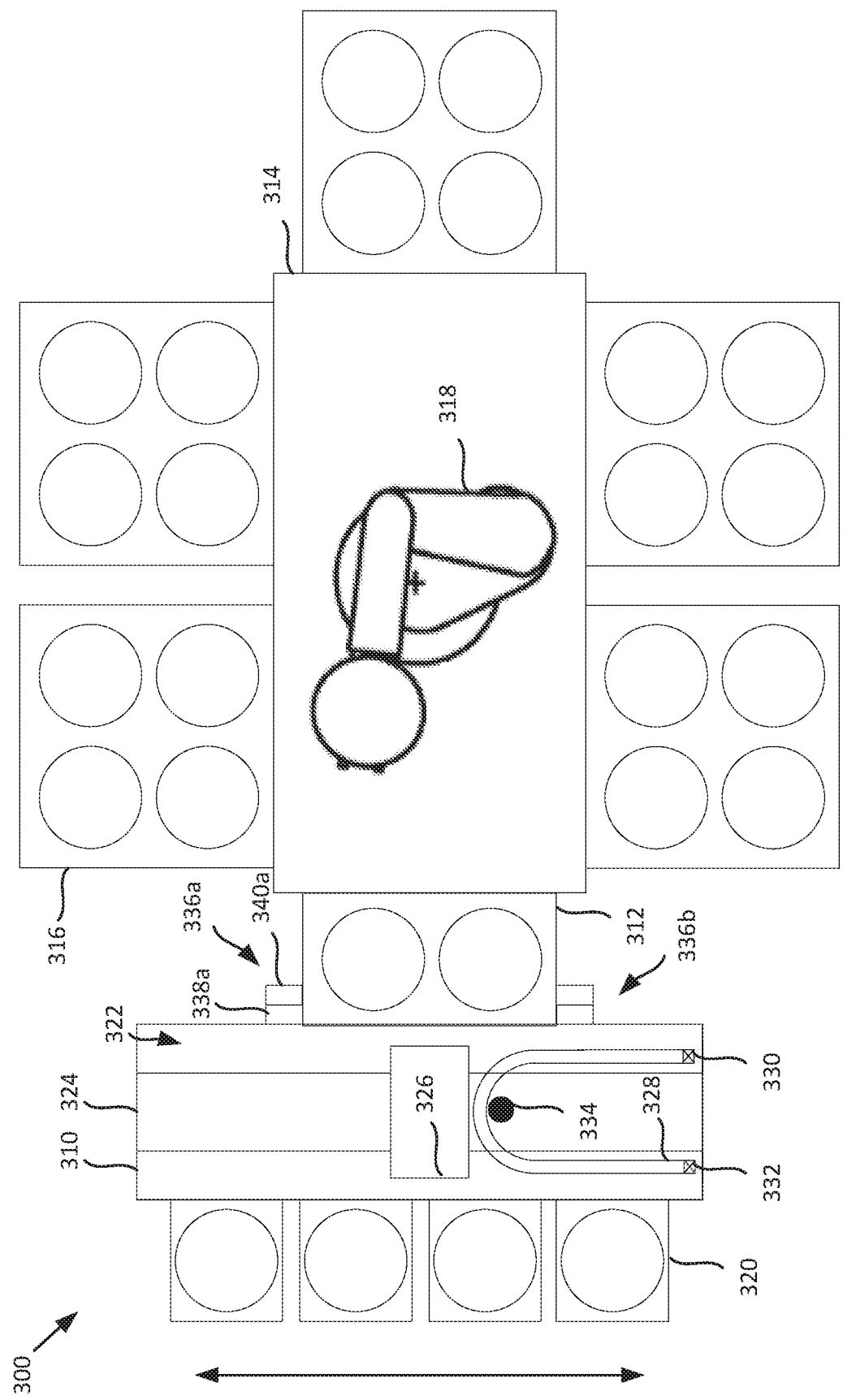
FIG. 3A is another top schematic view of an electronic device manufacturing system including a factory interface oriented at a first position, according to aspects of the present disclosure.

FIG. 3A is another top schematic view of an electronic device manufacturing system 300 including a factory interface 310 oriented at a first position, according to aspects of the present disclosure. Factory interface 310 can be a factory interface of an electronic device manufacturing system 300, such as factory interface 106 of electronic device manufacturing system 100. Electronic device manufacturing system 300 can include at least a load lock 312, a transfer chamber 314, and one or more processing chambers 316. Transfer chamber 314 can include a transfer chamber robot 318, which can be configured to transfer substrates to and/or from load lock 312 to a processing chamber 316, in accordance with previously described embodiments. Factory interface 310 can be configured to receive substrates from substrate carriers 220, in accordance with previously described embodiments.

Factory interface 310 can include one or more moveable components that cause factory interface 310 to be moveable between a first position and a second position and/or a first position and a third position. In some embodiments, the one or more moveable components can include a linear slide 322 disposed at the bottom of factory interface 310. In some embodiments, linear slide 322 can be the same or similar to linear slide 222 described with respect to FIGS. 2A-2B. In some embodiments, linear slide 322 can be disposed at the bottom of factory interface 310 such that factory interface 310 can be moved in multiple directions (e.g., between the first position and the second position and between the first position and the third position), as illustrated in FIG. 3A.

One or more utility lines can be configured to provide utilities to factory interface 310. A utility cable 328 can be configured to protect the one or more utility lines, in accordance with previously described embodiments. Electronic device manufacturing system 300 can include one or more locking mechanisms, such as locking mechanism 336a and/or locking mechanism 336b. The one or more locking mechanisms 336a, 336b can be configured to secure factory interface 310 in the first position during operation of electronic device manufacturing system 300 or in the second position during maintenance of factory interface 310, load lock 312, transfer chamber 314, and/or one or more processing chambers 316, in accordance with previously described embodiments.

Figure 3C:
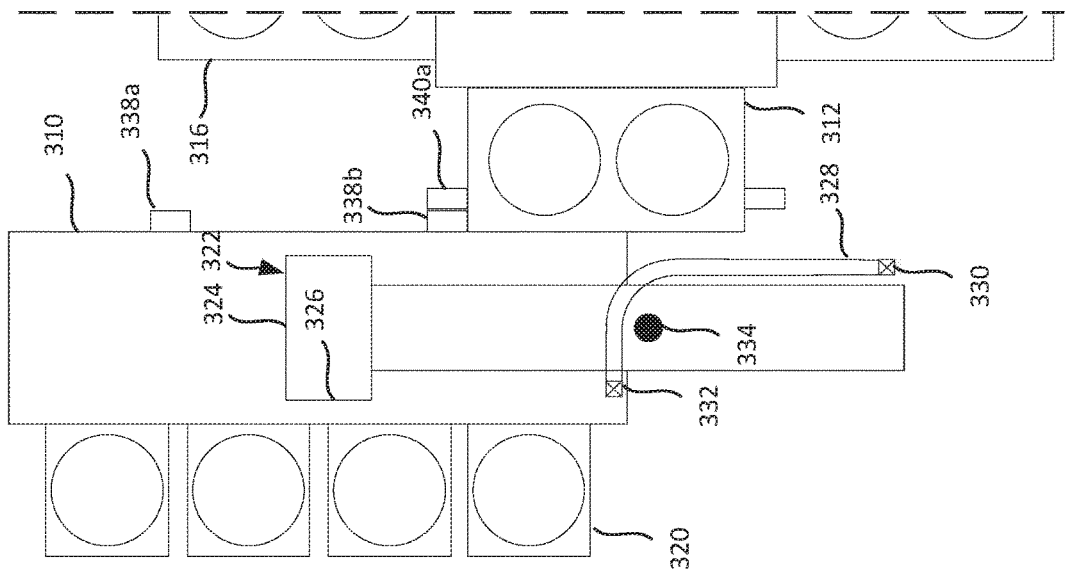
FIG. 3C is a top schematic view of an electronic device manufacturing system including a factory interface oriented at a third position, according to aspects of the present disclosure.
Figure 3B:
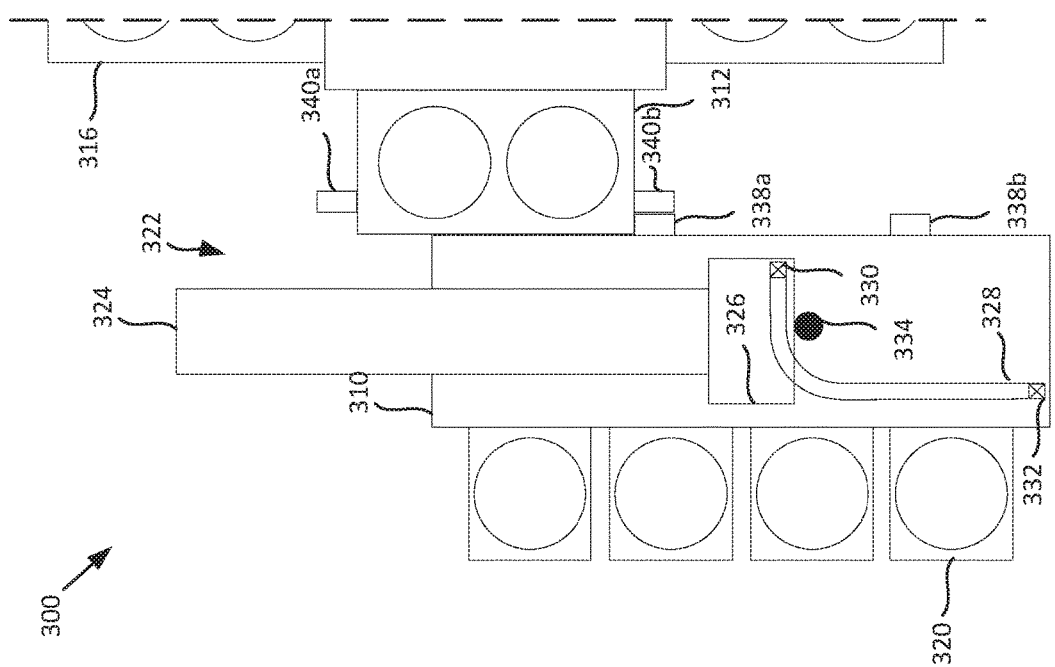
FIG. 3B is another top schematic view of an electronic device manufacturing system including a factory interface oriented at a second position, according to aspects of the present disclosure.

FIG. 3B is another top schematic view of an electronic device manufacturing system 300 including a factory interface 310 oriented at a second position, according to aspects of the present disclosure. In some instances, a factory operator can provide maintenance for factory interface 310, load lock 312, transfer chamber 314, and/or one or more processing chambers 316. In such instances, factory interface 310 can be moved from the first position to a second position such to provide maintenance access to factory interface 310, load lock 312, transfer chamber 314 and/or processing chambers 316. To move factory interface 310 from the first position to the second position, the first portion 338a of locking mechanism 336a can be disengaged from the second portion 340a of locking mechanism 336a. In some embodiments, the first portion 338b of locking mechanism 336b is disengaged from the second portion 340b of locking mechanism 336b. In some embodiments, locking mechanism 336b can also be used to secure factory interface 310 in the second position during maintenance of factory interface 310, load lock 312, transfer chamber 314, and/or one or more processing chambers 316. In such embodiments, the first portion 338a of locking mechanism 336a can engage with a second portion 340b of locking mechanism 336b when factory interface 310 is in the second position.

In some embodiments, factory interface 310, when moved from the first position to the second position, is moved between approximately 24 inches to approximately 60 inches. In other or similar embodiments, factory interface 310, when moved from the first position to the second position, is moved between approximately 24 inches to approximately 36 inches.

As previously described, a first end 330 of utility cable 328 can be mounted to an outlet of a utility supply (e.g., connected to the floor of electronic device manufacturing system 300). A second end 332 of utility cable can be mounted to an inlet of factory interface 310. As previously described, utility cable 328 can be long enough to allow for the first end 330 of utility cable 328 to be fastened to the outlet of the utility supply and the second end 332 of utility cable 328 to be mounted to the inlet of factory interface 310 as factory interface 310 is moved between the first and second position (e.g., approximately 24 inches to approximately 60 inches). Portions of utility cable 326 can rotate along the fixed point at the bottom of factory interface 310 such to maintain the semi-circle shape along the fixed point as factory interface 310 is moved from the first position to the second position.

FIG. 3C is a top schematic view of an electronic device manufacturing system 300 including a factory interface 310 oriented at a third position, according to aspects of the present disclosure. In some instances, a factory operator can cause factory interface 310 to be moved from the first position to the third position in order to provide maintenance for factory interface 310, load lock 312, transfer chamber 314 and/or one or more processing chambers 316. To move factory interface 310 from the first position to the second position, the operator can cause the first portion 338a of locking mechanism 336a disengage from the second portion 340a of locking mechanism 336a. In some embodiments, the operator can also cause the first portion 338b of locking mechanism 336b to disengage from the second portion 340b of locking mechanism 336b. In some embodiments, locking mechanism 336a can also be used to secure factory interface 310 in the second position during maintenance of factory interface 310, load lock 312, transfer chamber 314 and/or one or more processing chambers 316. In such embodiments, the first portion 338b of the locking mechanism 336b engages with the second portion 340a of the locking mechanism 336a when factory interface 310 is in the second position. In accordance with the previous illustrative example, when factory interface 310 is moved from the first position to the third position, the first plate of locking mechanism 336b can align with the second plate of locking mechanism 336a. The fastening component (e.g., a screw) can be fed through the hole of the first plate of locking mechanism 336b and the hole of the second plate of locking mechanism 336a in order to secure factory interface 310 in the third position.

In some embodiments, factory interface 310, when moved from the first position to the third position, is moved between approximately 24 inches to approximately 60 inches. In other or similar embodiments, factory interface 310, when moved from the first position to the third position, is moved between approximately 24 inches to approximately 36 inches.

As previously described, a first end 330 of utility cable 328 can be mounted to an outlet of a utility supply (e.g., connected to the floor of electronic device manufacturing system 300). A second end 332 of utility cable can be mounted to an inlet of factory interface 310. Portions of utility cable 326 can rotate along the fixed point 334 at the bottom of factory interface 310 such to maintain the semicircle shape along the fixed point 334 as factory interface 310 is moved from the first position to the third position.

Figure 4A:
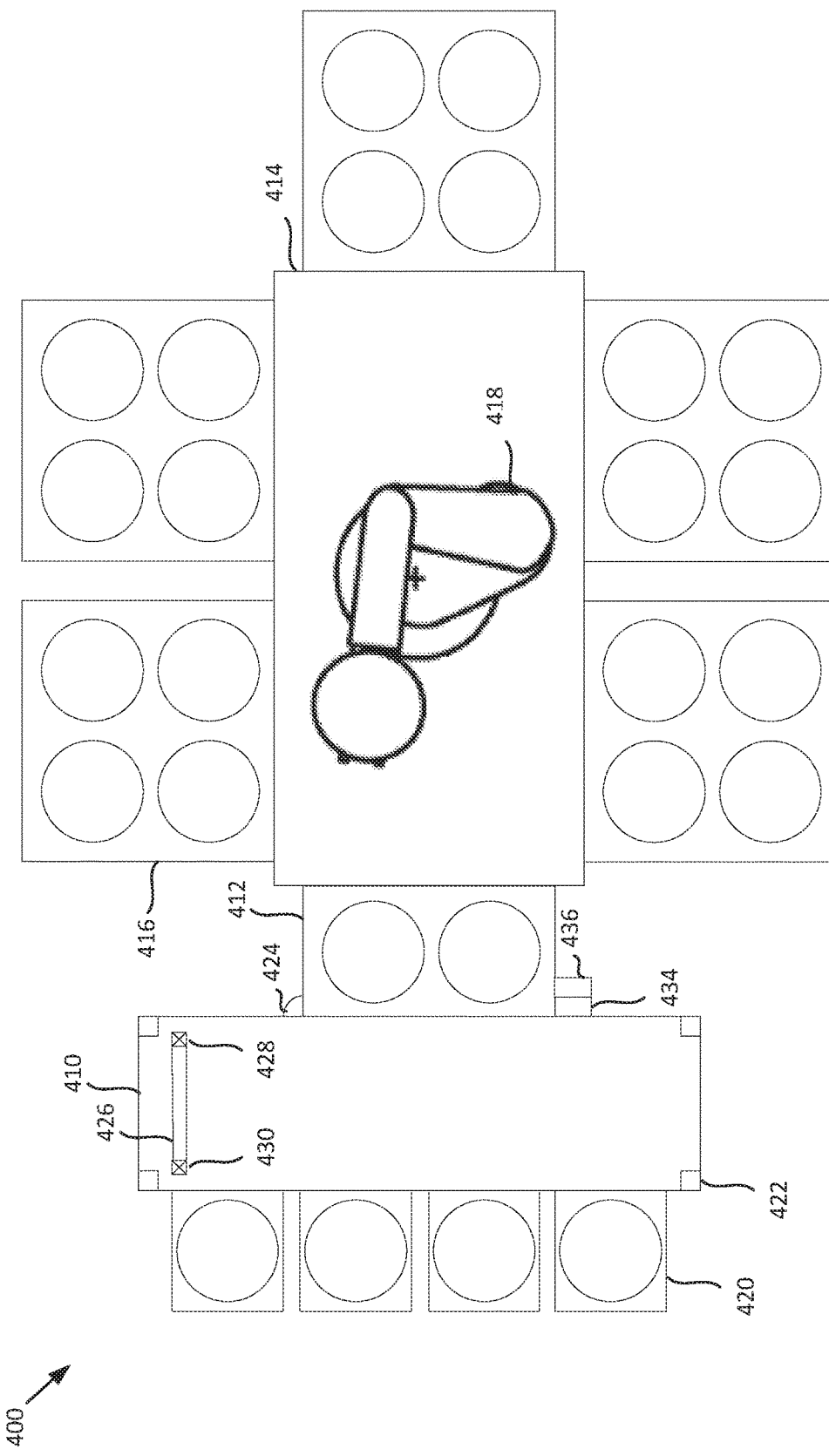
FIG. 4A is another top schematic view of an electronic device manufacturing system including a factory interface oriented at a first position, according to aspects of the present disclosure.

FIG. 4A is another top schematic view of an electronic device manufacturing system 400 including a factory interface 410 oriented at a first position, according to aspects of the present disclosure. Factory interface 410 can be a factory interface of an electronic device manufacturing system 400, such as factory interface 106 of electronic device manufacturing system 100. Electronic device manufacturing system 400 can include at least a load lock 412, a transfer chamber 414, and one or more processing chambers 416. Transfer chamber 414 can include a transfer chamber robot 418, which can be configured to transfer substrates to and/or from load lock 412 to a processing chamber 416, in accordance with previously described embodiments.

Factory interface 410 can include one or more moveable components that cause factory interface 410 to be moveable between a first position and a second position. In some embodiments, the one or more moveable components can include one or more wheels 422 mounted to a bottom of factory interface 410 and a hinge 424. In some embodiments, the one or more moveable components include a hinge 424 mounted to factory interface 410 and load lock 412. Hinge 424 can secure a first side of factory interface 410 in place while wheels 422 can allow a second side of factory interface 410 to move away from load lock 412, as illustrated with respect to FIG. 4B. Alternatively, the factory interface can include the wheels but omit the hinge, or can include the hinge but omit the wheels.

In accordance with previously described embodiments, one or more utility lines can be configured to provide utilities to factory interface 410. A utility cable 426 can be configured to protect one or more utility lines. A first end 428 of utility cable 426 can be mounted to an outlet of a utility supply, in accordance with previously described embodiments. In some embodiments, a first end 428 of utility cable 426 can further include a rotary component that facilitates rotation of utility cable 426 as factory interface 410 moves from the first position to the second position. A second end 430 of utility cable 426 can be mounted to an inlet of factory interface 410, in accordance with previously described embodiments.

Electronic device manufacturing system 400 can include a locking mechanism 432 to secure factory interface 410 in the first position during operation of electronic device manufacturing system 400. Locking mechanism 432 can operate in accordance with previously described embodiments. To move factory interface 410 from the first position to the second position, an operator can cause a first portion 434 of locking mechanism 432 to disengage from a second portion 436 of locking mechanism 432, in accordance with previously described embodiments.

Figure 4B:
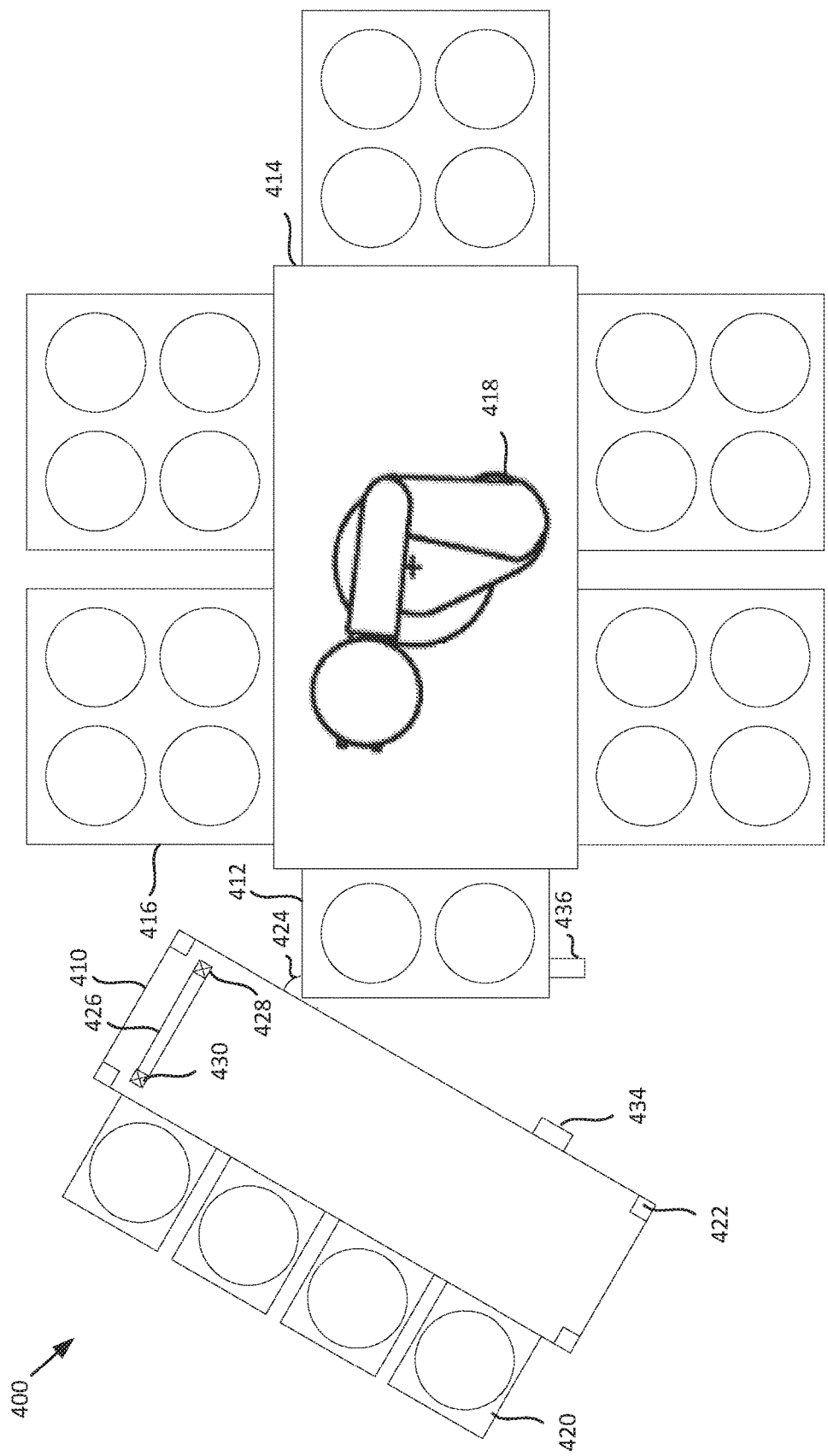
FIG. 4B is another top schematic view of an electronic device manufacturing system including a factory interface oriented at a second position, according to aspects of the present disclosure.

FIG. 4B is another top schematic view of an electronic device manufacturing system 400 including a factory interface 410 oriented at a second position, according to aspects of the present disclosure. As described previously, an operator can move factory interface 410 from the first position to the second position by causing a first portion 434 of locking mechanism 432 to disengage from a second portion 436 of locking mechanism 432. Hinge 424 can secure the first side of factory interface 410 in place while wheels 422 can allow a second side of factory interface 410 to move away from load lock 412. As factory interface 410 is moved from the first position to the second position, first end 428 of utility cable 426 can remain mounted to the outlet of the utility supply while second end 430 of utility cable 426 remains mounted to the inlet of factory interface 410.

In some embodiments, hinge 424 and wheels 422 can allow the second side of factory interface 410 to rotate between approximately 10° to approximately 50° away from load lock 412. In other or similar embodiments, hinge 424 and wheels 422 can allow the second side of factory interface 410 to rotate between approximately 20° to approximately 30° away from load lock 412. The rotation of the second side of factory interface 410 away from load lock 412 can create an opening between factory interface 410 and load lock 412 of between approximately 24 inches to approximately 60 inches. In some embodiments, the rotation of the second side of factory interface 410 away from load lock 412 can create an opening of between approximately 24 inches to approximately 36 inches.

Figure 5:
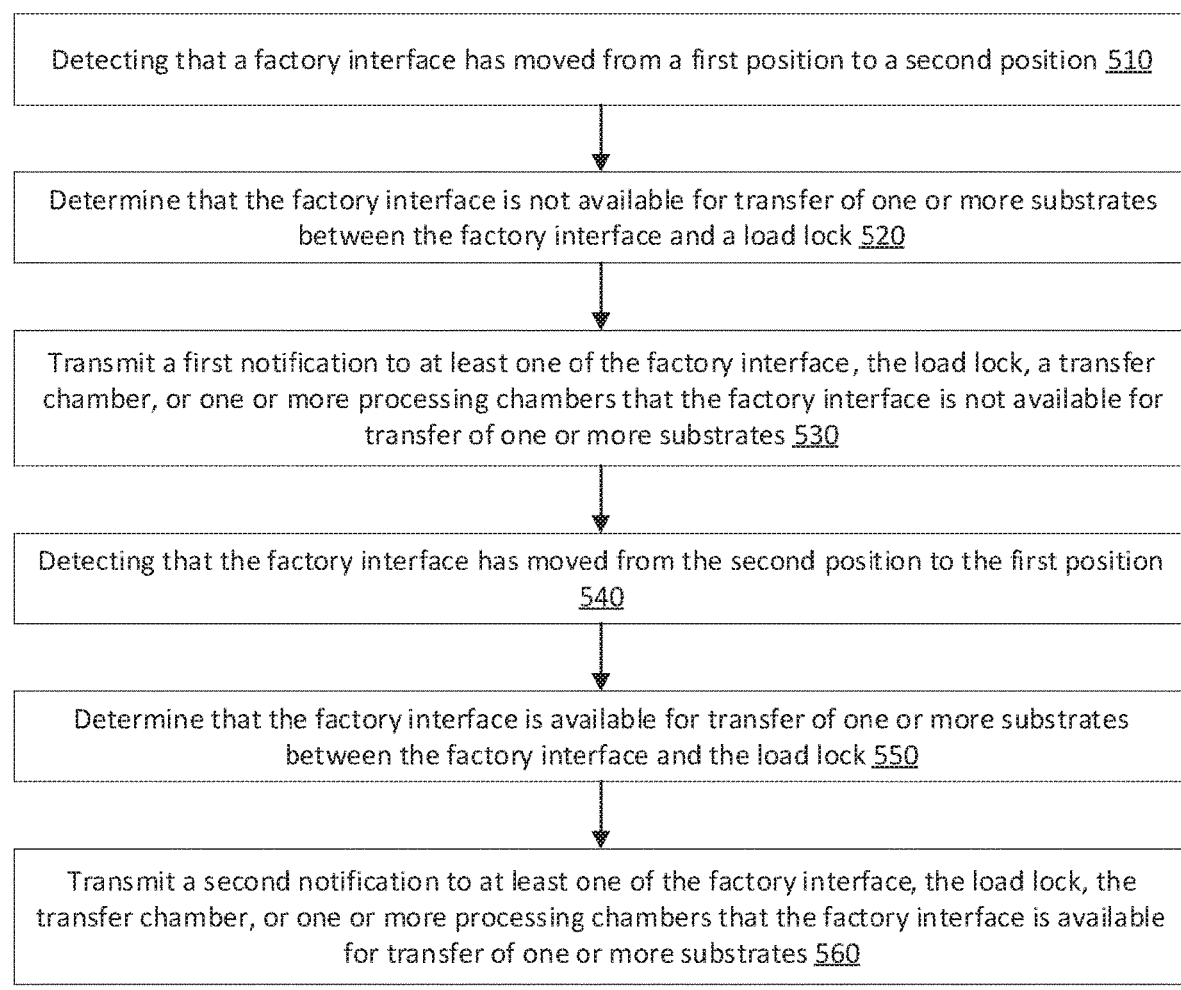
FIG. 5 is a method for transmitting a notification to one or more components of an electronic device manufacturing, in accordance with embodiments of the present disclosure.

FIG. 5 is a method for transmitting a notification to one or more components of an electronic device manufacturing system indicating whether a factory interface is available for transfer of one or more substrates between the factory interface and a load lock of the electronics manufacturing system, in accordance with embodiments of the present disclosure. At block 510, a system controller detects that a factory interface has moved from a first position to a second position. The first indication can be received in response to a first portion of a locking mechanism of the factory interface disengaging from a second portion of the locking mechanism of a loadlock of the electronic device manufacturing system. At block 520, it is determined that the factory interface is not available for transfer of one or more substrates between the factory interface and a load lock. At block 530, a first notification is transmitted to at least one of the factory interface, the load lock, a transfer chamber, or one or more processing chambers that the factory interface is not available for transfer of one or more substrates. At block 540, the system controller detects that the factory interface has moved from the second position to the first position. At block 550, it is determined that the factory interface is available for transfer of one or more substrates between the factory interface and the load lock. At block 560, a second notification is transmitted to at least one of the factory interface, the load lock, the transfer chamber, or one or more processing chambers that the factory interface is available for transfer of one or more substrates.

Figure 6:
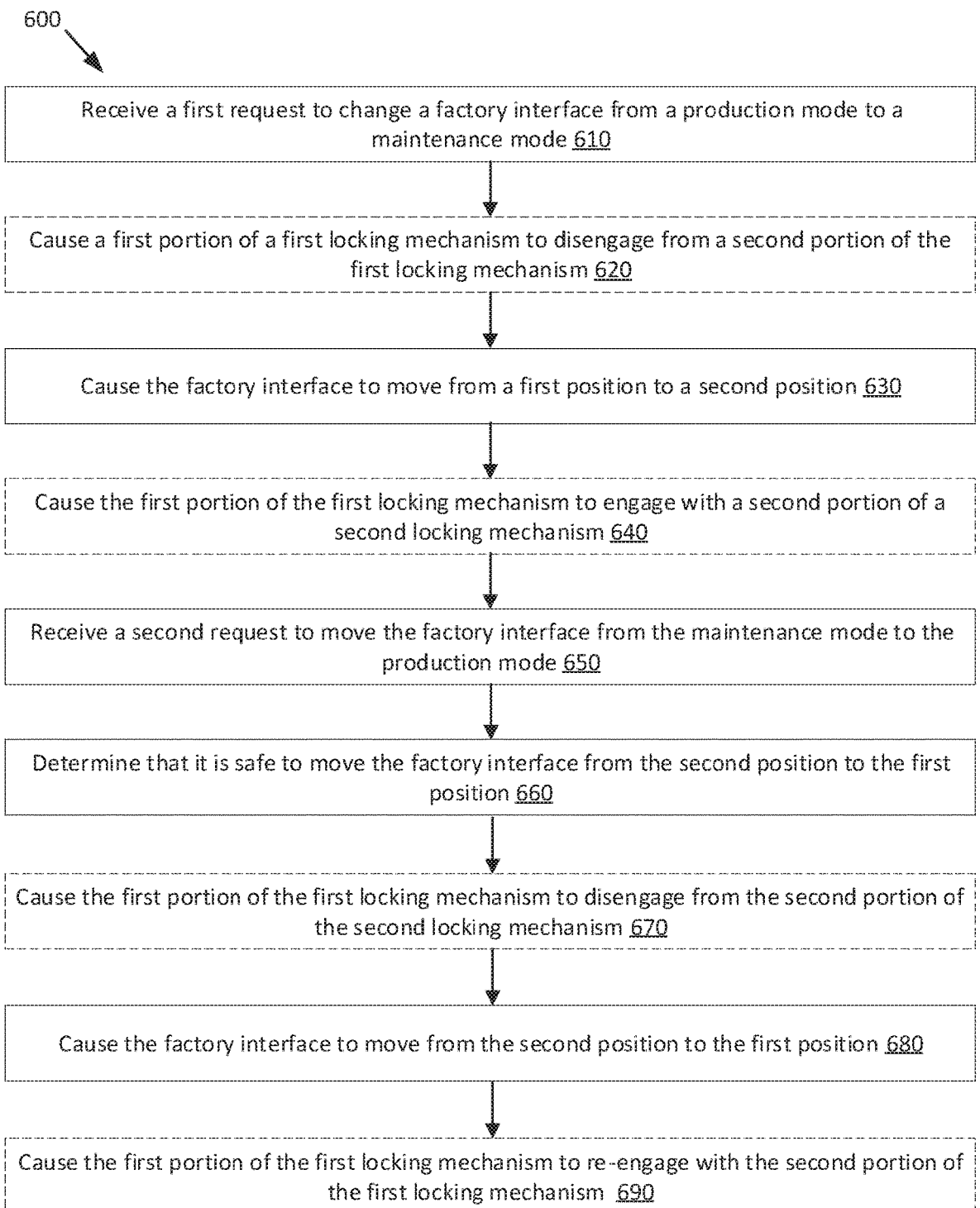
FIG. 6 is a method for changing a factory interface from a production mode to a maintenance mode, in accordance with embodiments of the present disclosure.

FIG. 6 is a method 600 for changing a factory interface from a production mode to a maintenance mode, in accordance with embodiments of the present disclosure. In some embodiments, method 600 is performed by a controller of an electronic device manufacturing system, such as system controller 128 of FIG. 1. At block 610, the system controller receives a first request to change a factory interface from a production mode to a maintenance mode. The factory interface can be positioned in a first position while in the production mode, in accordance with previously described embodiments. At block 620, the system controller optionally causes a first portion of a first locking mechanism to disengage from a second portion of the first locking mechanism. In some embodiments, the system controller optionally causes a first portion of a second locking mechanism to disengage from a second portion of the second locking mechanism. In some embodiments, the first locking mechanism and/or the second locking mechanism is an automated locking mechanism that can be engaged and disengaged by the system controller.

At block 630, the system controller causes the factory interface to move from the first position to a second position. The factory interface can be positioned in the first position while in the maintenance mode, in accordance with previously described embodiments. In some embodiments, the system controller causes the factory interface to move from the first position to the second position using one or more automated moveable components, in accordance with previously described embodiments. At block 640, the system controller optionally causes the first portion of the first locking mechanism to engage with a second portion of a second locking mechanism. The first portion of the first locking mechanism can be configured to engage with the second portion of the locking mechanism to secure the factory interface in the second position.

At block 650, the system controller receives a second request to move the factory interface from the maintenance mode to the production mode. At block 660, the system controller determines that it is safe to move the factory interface from the second position to the first position. In some embodiments, a sensor of the electronic device manufacturing system can transmit a signal to the system controller indicating that it is safe to move the factory interface from the second position to the first position (e.g., there are no obstacles obstructing the path of the factory interface moving from the second position to the first position).

At block 670, the system controller optionally causes the first locking mechanism to disengage from the second portion of the second locking mechanism. At block 680, the system controller causes the factory interface to move from the second position to the first position. At block 690, the system controller optionally causes the first portion of the first locking mechanism to re-engage with the second portion of the first locking mechanism.

FIG. 7 is a method 700 for moving a factory interface of an electronic device manufacturing system between a first and second position, in accordance with embodiments of the present disclosure. In some embodiments, method 700 is performed by the factory interface the electronic device manufacturing system. In other or similar embodiments, method 700 is performed by an operator of the electronic device manufacturing system.

At optional block 710, a first portion of the first locking mechanism is disengaged from a second portion of the first locking mechanism. At block 720, the factory interface is moved from the first position to the second position. At optional block 730, the first portion of the first locking mechanism is engaged with a second portion of a second locking mechanism. At optional block 740, maintenance is performed at one or more processing chambers, a transfer chamber, and/or a load lock of the electronic device manufacturing system. At optional block 750, a first portion of the first locking mechanism is disengaged from the second portion of the second locking mechanism. At block 760, the factory interface is moved from the first position to the second position. At optional block 770, the first portion of the first locking mechanism is re-engaged with the second portion of the first locking mechanism.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An electronic device manufacturing system, comprising:
   a transfer chamber;
   a plurality of processing chambers connected to the transfer chamber;
   a load lock connected to the transfer chamber; and
   a factory interface connected to the load lock, wherein the factory interface is moveable between a first position and a second position, and wherein:

the factory interface interfaces with a first side of the load lock;

the factory interface, while oriented in the first position, is positioned for transfer of one or more substrates between the factory interface and the load lock, wherein at least one of the transfer chamber or the load lock are inaccessible for maintenance while the factory interface is oriented at the first position;

the factory interface, while oriented in the second position, is positioned to provide maintenance access to at least one of the transfer chamber or the load lock;

the factory interface comprises one or more moveable components that cause the factory interface to be movable between the first position and the second position along an axis that is approximately parallel to the first side of the load lock; and the factory interface comprises one or more utility cables configured to protect one or more utility lines that provide utilities to the factory interface, wherein the one or more utility lines are positioned along a fixed point relative to the factory interface such that portions of the one or more utility cables maintain a particular shape around the fixed point as the factory interface is moved between the first position and the second position.

2. The electronic device manufacturing system of claim 1, wherein the first position is a first position relative to the load lock, and wherein the second position is a second position relative to the load lock.

3. The electronic device manufacturing system of claim 1, wherein the one or more moveable components comprise at least one of a hinge, a slide, or a set of wheels.

4. The electronic device manufacturing system of claim 1, wherein the factory interface comprises a linear slide disposed at a bottom of the factory interface.

5. The electronic device manufacturing system of claim 1, wherein a first end of the one or more utility cables is mounted to an outlet of a utility supply that has a fixed position that is unchanged between the first position of the factory interface and the second position of the factory interface and a second end of the one or more utility cables is mounted to an inlet of the factory interface.

6. The electronic device manufacturing system of claim 5, wherein the one or more utility lines comprise at least one of a power utility line configured to provide power to the factory interface, an air utility line configured to provide air to the factory interface, a vacuum utility line configured to provide a vacuum to the factory interface, or a nitrogen utility line configured to provide nitrogen to the factory interface.

7. The electronic device manufacturing system of claim 1, wherein the factory interface comprises a first portion of a locking mechanism and the load lock comprises a second portion of the locking mechanism, and wherein the first portion of the locking mechanism is configured to engage with the second portion of the locking mechanism such to secure the factory interface in the first position during operation of the electronic device manufacturing system.

8. The electronic device manufacturing system of claim 1, wherein the factory interface, when moved from the first position and the second position, is moved between approximately 24 to approximately 60 inches.

9. An electronic device manufacturing system, comprising:

a transfer chamber;

a plurality of processing chambers connected to the transfer chamber;

a load lock connected to the transfer chamber; and a factory interface connected to the load lock, wherein the factory interface is moveable between a first position and a second position, wherein:

the factory interface, while oriented in the first position, is positioned for transfer of one or more substrates between the factory interface and the load lock, wherein at least one of the transfer chamber or the load lock are inaccessible for maintenance while the factory interface is oriented at the first position;

the factory interface, while oriented in the second position, is positioned to provide maintenance access to at least one of the transfer chamber or the load lock;

the factory interface comprises a linear slide that enables the factory interface to be movable between the first position and the second position, wherein a first component of the linear slide is coupled to a bottom of the factory interface and a second component of the linear slide is coupled to a floor of the electronic device manufacturing system; and the factory interface comprises one or more utility cables configured to protect one or more utility lines that provide utilities to the factory interface, wherein the one or more utility lines are positioned along a fixed point relative to the factory interface such that the one or more utility cables maintain a particular shape around the fixed point as the factory interface is moved between the first position and the second position.

10. The electronic device manufacturing system of claim 9, wherein the load lock comprises a first side that interfaces with the factory interface, and wherein the linear slide permits motion of the factory interface along at least one of: a first axis that is approximately parallel to the first side of the load lock, or a second axis that is approximately perpendicular to the first side of the load lock.

* * * * *